(12) United States Patent
Tran et al.

(10) Patent No.: US 6,455,098 B2
(45) Date of Patent: Sep. 24, 2002

(54) WAFER PROCESSING APPARATUS AND METHOD

(75) Inventors: Khanh Tran, San Jose; Tom Kelly, Milipitas; Arin Chang, San Jose; Guy Mendez, Fremont, all of CA (US)

(73) Assignee: Semix Incorporated, Fremont, CA (US)

( * ) Notice: Subject to any disclaimer, the term of this patent is extended or adjusted under 35 U.S.C. 154(b) by 0 days.

(21) Appl. No.: 09/802,692

(22) Filed: Mar. 8, 2001

Related U.S. Application Data (60) Provisional application No. 60/188,605, filed on Mar. 9, 2000.

(51) Int. Cl.[7] .................................................. B05D 3/02
(52) U.S. Cl. ................... 427/8; 427/255.18; 427/255.5; 427/331; 427/337; 427/344; 427/444
(58) Field of Search .................................. 118/688, 690, 118/715, 719, 729; 427/10, 248.1, 8, 255.18, 255.5, 331, 337, 344, 444

(56) References Cited

U.S. PATENT DOCUMENTS

| | | | | |
|---|---|---|---|---|
| 4,433,951 A | * | 2/1984 | Koch | 414/217 |
| 4,888,199 A | * | 12/1989 | Felts | 427/10 |
| 5,232,508 A | * | 8/1993 | Arena | 118/719 |
| 5,262,201 A | * | 11/1993 | Chandra | 427/377 |
| 5,314,574 A | * | 5/1994 | Takahashi | 156/646 |
| 5,492,718 A | * | 2/1996 | O'Neill | 427/8 |
| 5,695,568 A | | 12/1997 | Sinha et al. | 118/729 |
| 5,734,165 A | * | 3/1998 | Unal | 250/338.1 |
| 5,848,670 A | * | 12/1998 | Salzman | 118/729 |
| 5,882,419 A | * | 3/1999 | Sinha | 118/729 |
| 5,891,251 A | * | 4/1999 | MacLeish | 118/719 |
| 5,951,775 A | * | 9/1999 | Tepman | 118/729 |
| 6,183,564 B1 | * | 2/2001 | Reynolds | 118/719 |

OTHER PUBLICATIONS

Hitchman, Chemical Vapor Deposition Principles and Applications, Academic Press, N.Y. pp 110–129, 1993.*

* cited by examiner

*Primary Examiner*—Richard Bueker
(74) *Attorney, Agent, or Firm*—Haverstock & Owens LLP (57) ABSTRACT

A method and apparatus are described for transferring processing structures between first and second processing environments. The apparatus includes a first apparatus compartment configured to provide the first processing environment and a second apparatus compartment configured to provide the second processing environment. The apparatus is preferably configured for transferring wafer structures between the processing environments. The first and second processing environments are coupled together through a transfer passage that is opened and closed in order to isolate the wafer in a small transfer volume between the processing environments. Preferably, the transfer passage is opened and closed with first and second movable tables to create the small volume transfer cavity. In operation, the wafer is isolated within the small volume transfer cavity and the first and second tables are individually raised and lowered to expose the wafer to the first and second processing environments without opening the transfer passage between the first and second apparatus compartments. According to an embodiment of the invention, the apparatus is configured with a chemical delivery system that monitors the chemical composition or chemical concentration within the second apparatus compartment and supplies the appropriate quantity of chemical or chemicals to maintain a selected composition or concentration therein. According to a preferred embodiment the apparatus is configured for processing wafers coated with silicon-based materials to produce porous low-k coatings.

7 Claims, 7 Drawing Sheets

WAFER PROCESSING APPARATUS AND METHOD

RELATED APPLICATION(S)

This Patent Application claims priority under 35 U.S.C. 119(e) of the co-pending U.S. Provisional Patent Application, Ser. No. 60/188,605, filed Mar. 9, 2000, and entitled "AGING CHAMBER FOR LOW-K CHEMICAL". The Provisional Patent Application, Ser. No. 60/188,605, filed Mar. 9, 2000, and entitled "AGING CHAMBER FOR LOW-K CHEMICAL" is also hereby incorporated by reference.

FIELD OF THE INVENTION

The present invention is related to wafer processing. More particularly, the present invention relates to an apparatus and method for processing wafers in multiple processing environments.

BACKGROUND OF THE INVENTION

State of the art integrated circuits can contain up to 6 million transistors and more than 800 meters of wiring. There is a constant push to increase the number of transistors on wafer-based integrated circuits. As the number of transistors is increased there is a need to reduce the cross-talk between the closely packed wire in order to maintain high performance requirements. The semiconductor industry is continuously looking for new processes and new materials that can help to improve the performance of wafer-based integrated circuits. For example, there is considerable excitement within the industry surrounding the use and application of a group of materials generically referred to as low-k materials or low-dielectric materials. Low-k materials have been shown to reduce cross-talk and provide a transition into the fabrication of even smaller geometry integrated circuitry.

Low-k materials are required to be compatible with other wafer fabrication processes, they must exhibit good adhesion, high thermal stability and low film stress. The k value of a material depends on several factors including how the materials is deposited on the wafer. $SiO_2$ has a k-value of approximately 4.0 and air has a k-value of 1.0. An ideal low-k material will have a k-value that approaches that of air. However, materials that exhibit k-values below 3.5 are considered low-k materials. Post treatment of coated materials can significantly reduce their observed k-value. For example, spin on glass materials and polymers can be treated to make porous siloxane coatings with k-values as low or below 2.0.

While low-k materials provide a promise for the fabrication of advanced micro circuitry, the deposition and subsequent treatment steps of low-k material in the wafer fabrication processing can lead to low throughput, increases in cost and low processing consistency. The wafer fabrication industry is continuously trying to balance state-of-the-art chip performance with the throughput, cost and consistency of wafer processing.

SUMMARY OF THE INVENTION

A wafer processing apparatus and method provides an apparatus and method for transferring a structure with a reaction surface from one processing environment to another processing environment. Preferably, the apparatus is configured to transfer a wafer from one processing environment to another processing environment. The wafer processing apparatus and method of the present invention transfers wafers with reaction surfaces from one processing environment to another processing environment while minimizing cross-contamination between processing environments and minimizing the depletion of processing chemicals during the transfer process. Further, the wafer processing apparatus and method transfers a reaction surface of a wafer into a chemical environment, while exposing the entire reaction surface to the processing environment quickly and with minimal initial convection during the transfers, thereby enhancing the consistency and uniformity of the wafer processing.

The apparatus of the instant invention has a first apparatus compartment configured to provide a first processing environment and a second apparatus compartment configured to provide a second processing environment. The first and the second apparatus compartments are coupled through a transfer passage that is capable of being opened and closed to create a transfer cavity and isolating a small transfer volume. The transfer volume is preferably less than five times the volume of the wafer, or wafers, being transferred and is most preferably less than twice the volume of the wafer, or wafers, being transferred in order to reduce the potential for cross-contamination between the first processing environment and the second processing environment during the transfer processes between the first and second apparatus compartments. According to an embodiment of the instant invention, the apparatus is provided with a vacuum source or a gas purge coupled to the transfer cavity for purging the transfer volume between transfers further reducing cross-contamination between the first processing environment and the second processing environment during the transfer process. The small transfer volume, utilized in the apparatus and method of the present invention, also reduces depletion of chemicals in a processing environment of the first and/or second apparatus compartment resulting from multiple transfers.

Preferably, the transfer cavity is formed from the transfer passage, a first movable table within the first apparatus compartment and a second movable table within the second apparatus compartment. The movable tables open and close ports of the transfer passage from within their respective compartments. The first and the second movable tables are configured to close together and isolate the wafer within the small transfer volume prior to exposing or transferring the wafer between the first processing environment and the second processing environment.

The apparatus preferably has a controllable chemical delivery system that maintains a chemical processing environment within the second compartment. Preferably, the chemical delivery system has a chemical sensor unit with one or more chemical sensors. The chemical sensor unit monitors the chemical composition, concentration or concentrations within the second apparatus compartment. The sensor unit controls a chemical supply, via feed back control circuitry, to deliver a processing chemical, or processing chemicals, to the second apparatus compartment in order to maintain a predetermined or selected composition or concentration value of the processing chemical in the second apparatus compartment.

According to an embodiment of the instant invention the chemical supply system is configured to deliver hydrated ammonia to the second apparatus compartment and the apparatus is configured for the treatment and aging of wafers coated with low-k spin-on-glass materials. At least one of the sensors is preferably a short path infrared sensor that measures the concentration of ammonia, water or both. If the measured concentration of ammonia or water is low, water or hydrated ammonia is supplied to the second apparatus compartment to reestablish the predetermined or selected concentration of hydrated ammonia within the second apparatus compartment. If the measured concentration of ammonia or water is high, the second apparatus compartment is purged with inert gas, or a vacuum is drawn on the second apparatus compartment, until the predetermined or selected concentration of hydrated ammonia is reestablished within the second apparatus compartment.

In operation, the wafer is placed on the first movable table within the first apparatus compartment with the second movable table in the closed position and capping the transfer passage between the first and second apparatus compartments. The processing environment within the first apparatus compartment is adjusted or maintained by any means known in the art to produce the desired outcome.

To expose and transfer the reaction surface of the wafer to the second processing environment, the second movable table is raised. Because the pressure and the chemical composition within the second processing environment is held substantially constant and because the entire reaction surface is exposed quickly to the chemical processing environment, the reaction surface of the wafer does not experience large fluctuations in chemical composition or exposure time to the surrounding processing environment. Thus, the method and apparatus of the present invention provides for consistent processing not only from wafer to wafer, but also throughout the surface of each wafer processed.

According to an alterative embodiment, prior to the step of exposing the wafer to the second processing environment, the transfer volume within the transfer cavity is purged to reduce contamination of the second processing environment with the small volume of the first processing environment captured within the transfer cavity.

According to a preferred embodiment of the invention, the second movable table is capable of being raised and lowered while the wafer is being exposed to the second processing environment. Moving the second movable table in an upward and downward motion creates a small amount of post exposure convection within the second processing environment and helps to quickly replenish processing chemicals at the reaction surface of the wafer and, thereby, helps to improve the throughput of the chemical processing step.

To transfer the wafer back to the first processing environment, the second movable table is placed in the closed position, thereby, capping the transfer passage and isolating the wafer in the transfer cavity. The first movable table is then lowered to expose and transfer the wafer back to the first processing environment. Alternatively, prior to the step of exposing and transferring the wafer back to the first processing environment, the transfer volume within the transfer cavity is purged to reduce contamination of the first processing environment with the small volume of the second processing environment captured within the transfer cavity. The purging includes steps such as drawing a vacuum on the transfer cavity and/or back filling the transfer cavity with a suitable processing environment or inert gas.

Preferably, the first movable table is configured to hold and support the wafer between transfers and support the wafer in the first apparatus compartment. Alternatively, the apparatus is configured with a wafer support for supporting the wafer above the first movable table, when the first movable table is in a lowered position. Within this embodiment, the wafer support comprises pin structures that pass through the first movable table, such that when the first movable table is lowered, the wafer is released onto the pins and when the first movable table is raised, the wafer is supported by the first movable table.

Preferably, the operation of the apparatus is automatically controlled by a controller or a computer, wherein a user selects a time of exposure of the wafer to the first and second processing environment, time of isolation of the wafer within the transfer cavity, concentrations of chemicals and the like. The at least one chemical sensor preferably continuously monitors the chemical composition or chemical concentration within the second process environment and is utilized to control the supply of the appropriate quantity of chemical or chemicals to maintain the selected composition or concentration.

The transfer mechanism of the instant invention is not limited to a two compartment wafer processing system. Any number of processing stations can be included within the apparatus, whereby wafers are moved from one station to the next and transferred between processing compartments by the mechanism described herein. Further, any number of more complex systems can be implemented to control the chemical environments within apparatus compartments. For example, each compartment can be equipped with an independently controllable chemical delivery system and monitoring system. Also, the transfer cavity itself can serve as a processing compartment and provide a separate and unique processing environment. According to the preferred embodiment of the invention, the apparatus is a modular processing station that is integrated into a multi-station wafer processing system.

DETAILED DESCRIPTION OF THE INVENTION

Figure 1A:
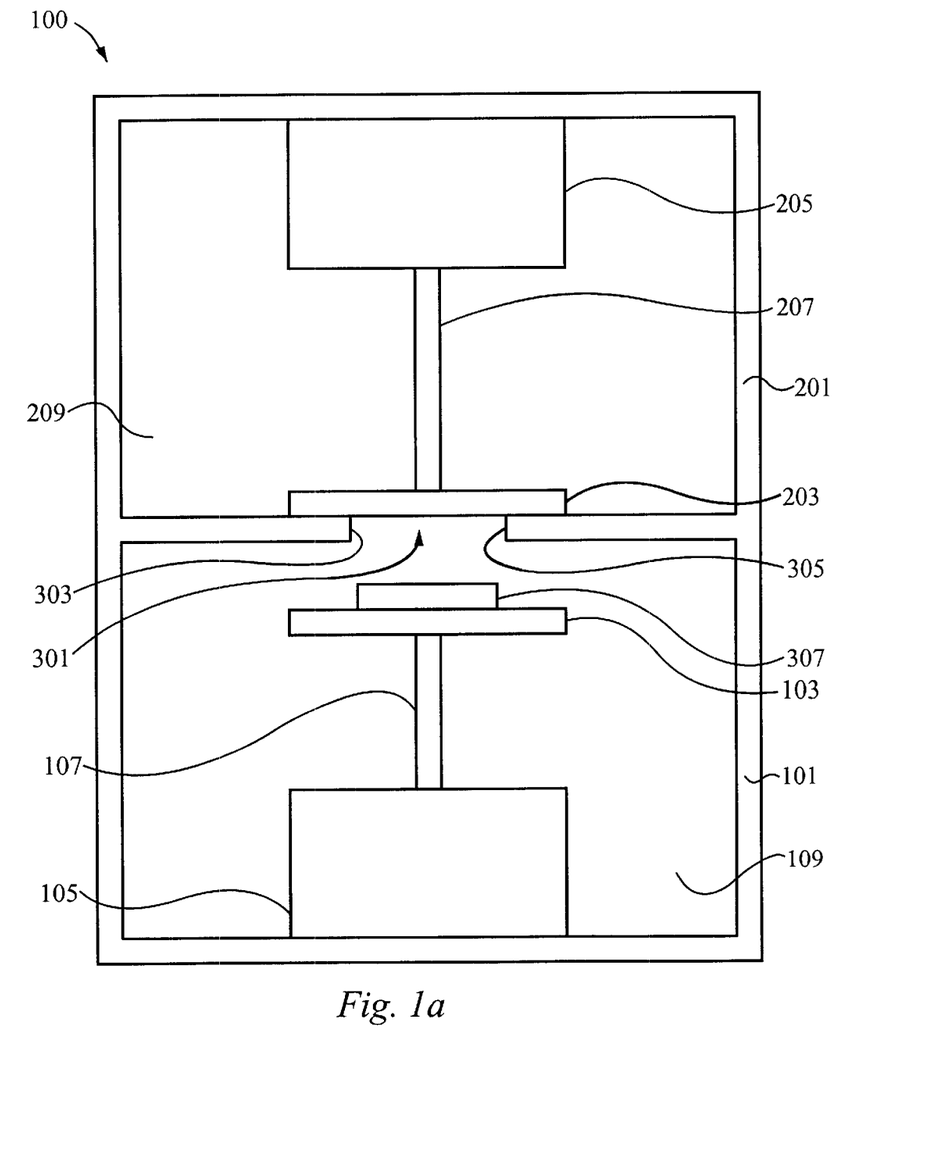
FIGS. 1a–c are schematic cross-sectional views of a multi-compartment wafer processing apparatus configured with movable tables for transferring a wafer from a first processing environment to a second processing environment, in accordance with the current invention.

A wafer processing apparatus and method of the present invention includes an apparatus and method for transferring materials from one processing environment to another processing environment. The wafer processing apparatus and method expose the reaction surface of the structure to the processing environments with minimal initial fluctuation in the environment and such that the entire reaction surface of the structure is exposed at substantially the same time. Referring to FIG. 1a, the apparatus 100 of the instant invention is preferably configured to transfer a wafer 307 from a first apparatus compartment 101 with a first processing environment 109 to a second apparatus compartment 201 with a second processing environment 209. The apparatus has a first apparatus compartment 101 configured to supply the first processing environment 109 and a second apparatus compartment 201 configured to supply the second processing environment 209. The compartments 101 and 201 are coupled through a transfer passage 301 that is capable of being opened and closed to create a transfer cavity 301', shown in FIG. 1b, wherein the transfer cavity 301' has a relatively small transfer volume. The transfer volume is preferably less than 10% of the volume of the second apparatus compartment 201 and less than five times the volume occupied by the wafer 307. The small transfer volume helps to ensure that cross-contamination between the first processing environment 109 and the second processing environment 209 is reduced during the transfer process. Preferably, the transfer cavity 301' is formed from the walls 303 and 305 of the transfer passage 301, a first movable table 103, within the first apparatus compartment 101, and a second movable table 203, within the second apparatus compartment 201.

Figure 1B:
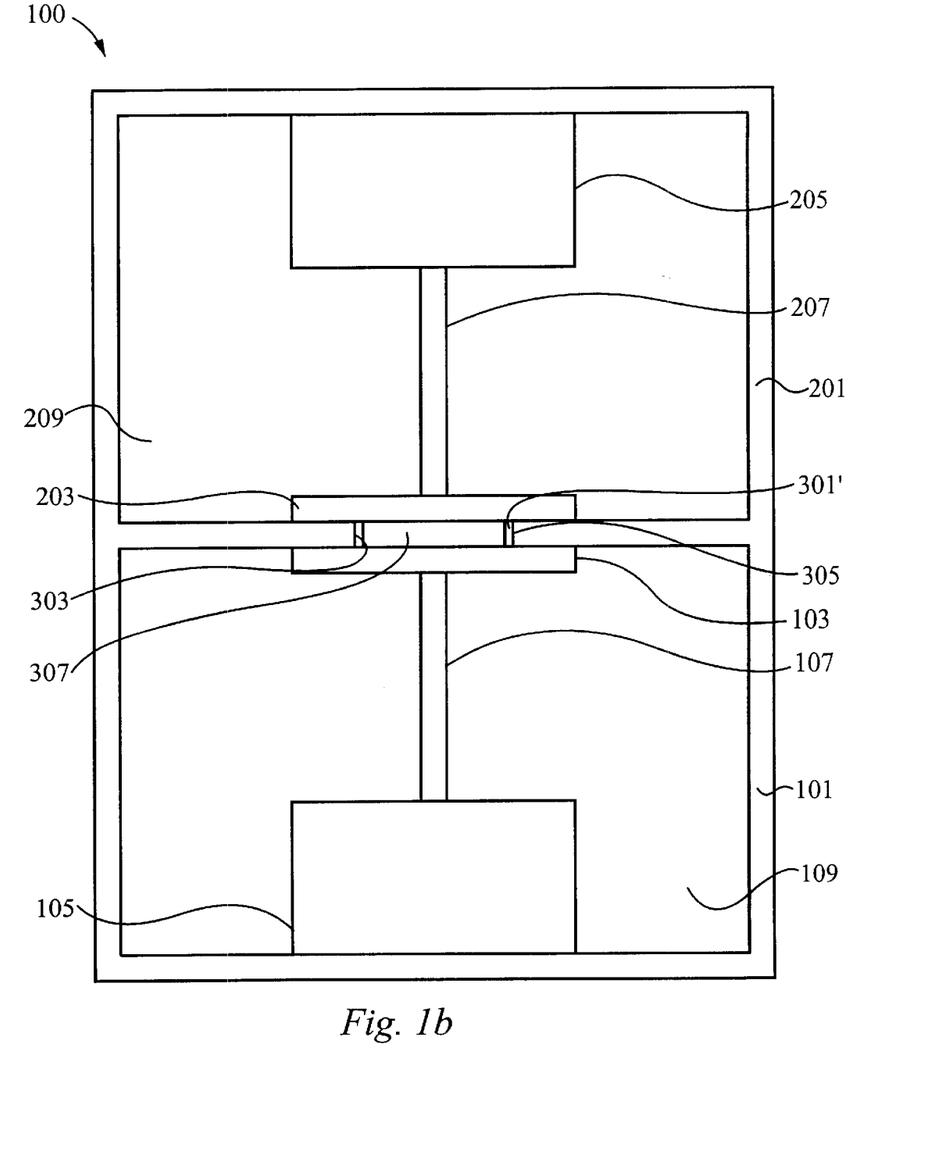

Now referring to FIG. 1b the first movable table 103 is configured to move up and down with a first drive motor 105. The first drive motor preferably moves the first movable table 103 up and down through a first shaft structure 107. A second drive motor 205 is coupled to the second movable table 203 and moves the second movable table 203 up and down through a second shaft structure 207. In operation, the first drive motor 105 and the second drive motor 205 are controlled so that preferably one of the first movable table 103 and the second movable table 203 is always in the closed position. Further, the first movable table 103 and the second movable table 203 are controlled so that both of the tables 103 and 203 are in a closed position and isolate the wafer 307 in the transfer passage 301, between the first apparatus compartment 101 and the second apparatus compartment 201 (as shown in FIG. 1b). Preferably, the first movable table 103 is configured to hold and support the wafer 307 while transferring the wafer 307 between the first processing environment 109 and the second processing environment 209 and while the wafer 307 is isolated within the small transfer volume 301'. While the second movable table 203 is preferable for closing the port of the transfer passage 301, it will be clear for the ensuing description that other means for closing the port of the transfer passage are within the scope of the invention. For example, instead of the second movable table 203 which moves up and down, the apparatus could also be configured with a cover that moves from side-to-side in order to close the transfer passage 301 and isolate the wafer 307 within the transfer cavity 301'.

Figure 1C:
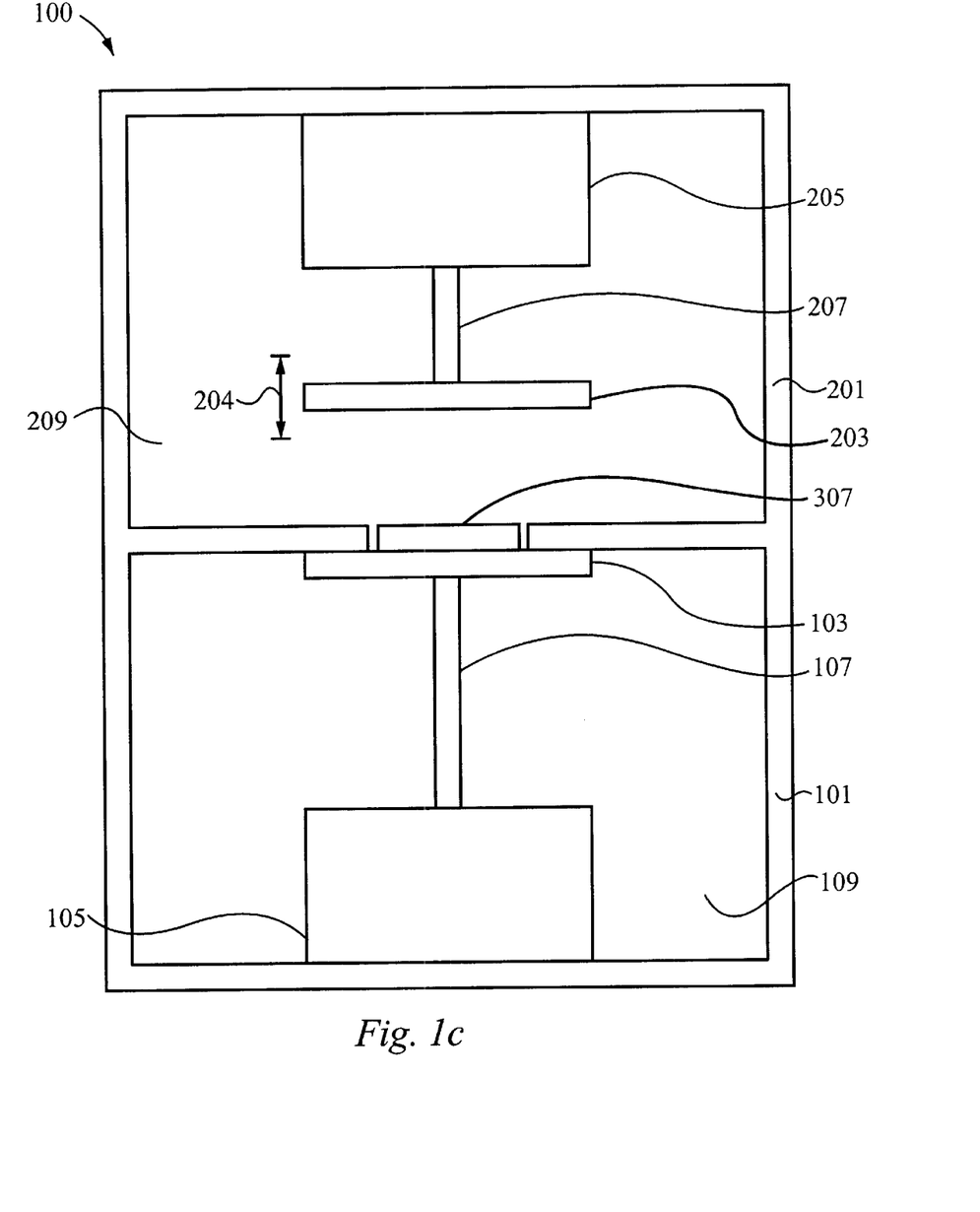

Now referring to FIG. 1c, after the wafer 307 is isolated within the small transfer volume 301', then the second movable table 203 is moved to an upward position, thereby, exposing and transferring the wafer 307 to the second processing environment 209. Still referring to FIG. 1c, the second movable table 203 is preferably configured to move up and down through a distance 204 in order to create post exposure convection within the second processing environment 209. The convection helps to ensure that the second processing environment 209 is quickly replenished at the wafer 307 surface and helps to improve the throughput of the chemical processing steps.

Figure 2A:
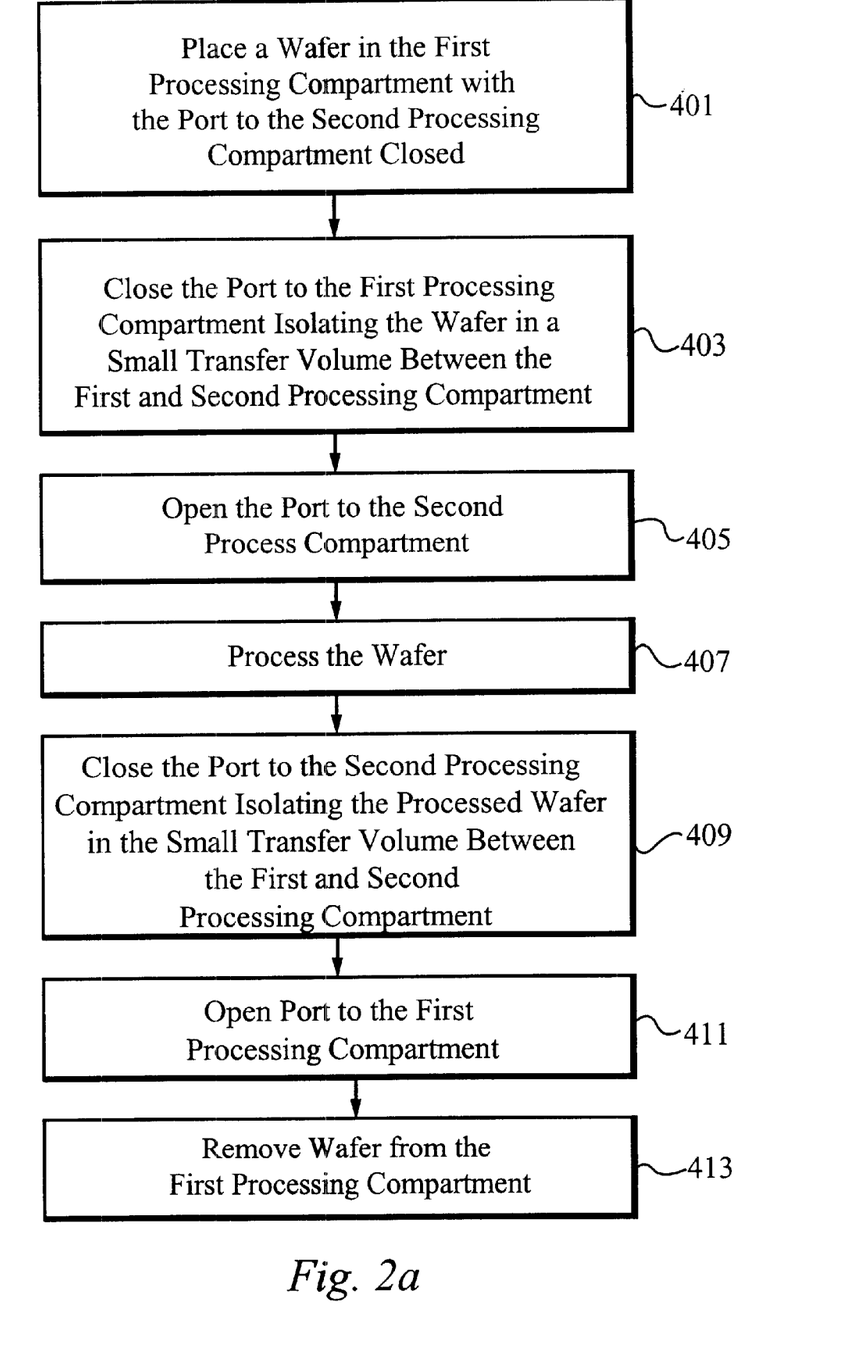
FIGS. 2a–b are flow block diagrams outlining the steps of the method for transferring a wafer from a first processing environment to a second processing environment, in accordance with the method of the current invention.

FIG. 2 is a block diagram outlining the steps of the method for transferring a wafer from a first processing environment to a second processing environment, in accordance with the method of the current invention. In the step 401, a wafer is placed within the first apparatus compartment on the first movable table with the transfer passage sealed to the second apparatus compartment, preferably with a second movable table. In the step 403, the first movable table is raised, thereby isolating the wafer within the transfer cavity formed from the transfer passage, the first movable table and the second movable table. After the wafer is isolated within the transfer cavity in the step 403, then in the step 405, the second movable table is raised, thereby exposing and transferring the wafer to the second processing environment.

Figure 2B:
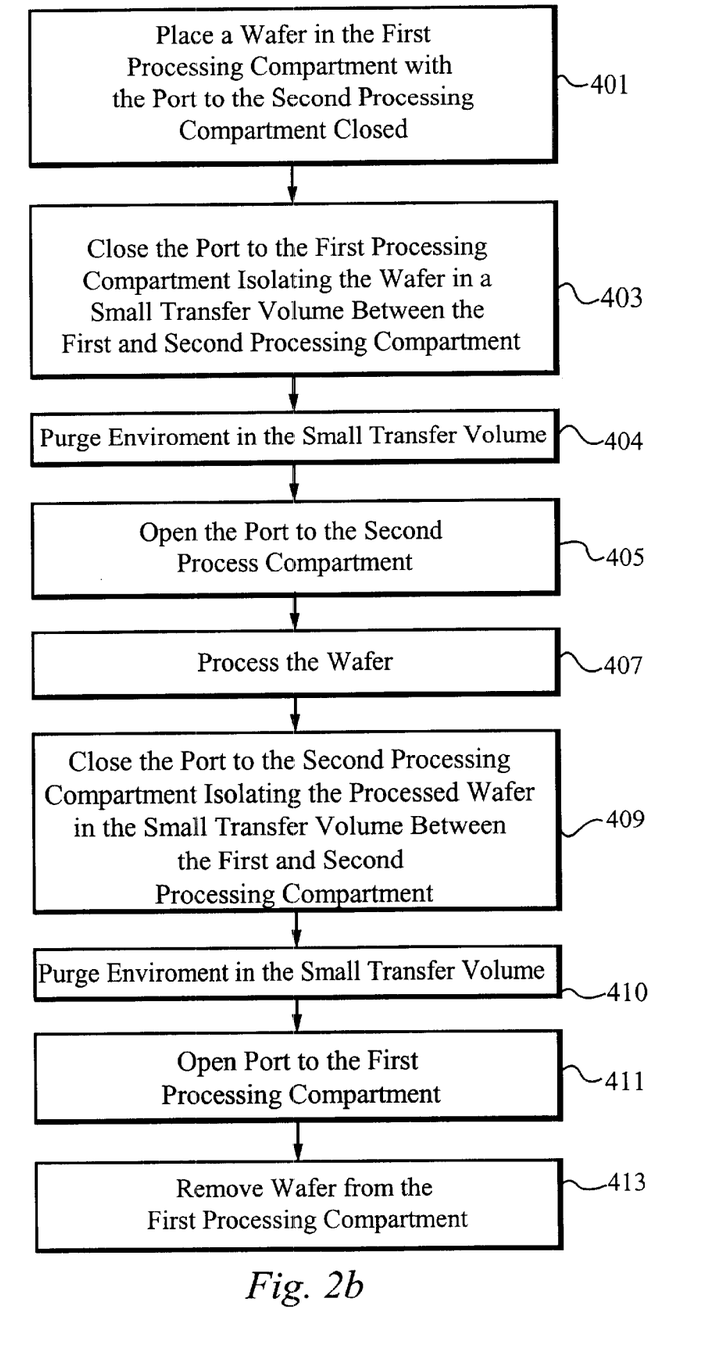

In an alternative embodiment, illustrated in FIG. 2b, prior to the step 405 of exposing the wafer to the second processing environment, in the step 404 the transfer volume within the transfer cavity is purged to reduce the contamination of the second processing environment with the small volume of the first processing environment captured within the transfer cavity. The step 404 of purging the transfer environment includes drawing a vacuum on the transfer cavity or back filling the transfer cavity with any suitable processing environment or inert gas.

After the step 405 of exposing the wafer to the second processing environment, in the step 407, the wafer is processed. The processing step 407 includes any appropriate processing step, but is preferably a chemical processing step of the wafer, whereby a processing chemical within the second processing environment is monitored and maintained by a controllable chemical delivery system. It is also preferred that the chemical processing environment is provided with convection by moving the second table up and down, as described in detail above. After the wafer is processed by the processing environment in the step 407, then in the step 409 the second movable table is placed in the closed position to cap the transfer passage and isolate the wafer within the transfer cavity. After the wafer is isolated within the transfer cavity in the step 409, then in the step 411 the first movable table is lowered to expose and transfer the wafer to the first processing environment. After the step 411 of exposing the wafer to the first processing environment, then in the step 413 the wafer is removed from the first movable table for additional processing steps or is transferred to a different processing station within the apparatus.

Alternatively, in the embodiment illustrated in FIG. 2b, prior to the step 411 of exposing the wafer to the first processing environment, in the step 410 the transfer volume within the transfer cavity is purged to reduce contamination of the first processing environment with the small volume of the second processing environment captured within the transfer cavity.

According to a preferred embodiment of the invention, the chemical supply system is configured to deliver hydrated ammonia to the second apparatus compartment and the apparatus is configured for the treatment and aging of wafers coated with low-k, or low dielectric, spin-on-glass materials. The wafer is prepared with the spin on glass material by coating the wafer with a glass material that is suspended in a suitable solvent. Suitable solvents include, but are not limited to, Tetradecane, for applications where a higher boiling point solvent is preferred, and Methyl-Isobutyl Ketone (MIBK), for applications where a lower boiling point solvent is preferred. Commercially available glass materials include XLK™ Spin, manufactured by Dow Corning at 20 W. Salzburg Rd., Midland Mich. 48686 and Nanoglass™ manufactured by GE/Allied Signal at 1349 Moffett Park Dr., Sunnyvale, Calif. 94089. The spin-on-glass suspension is applied to the processing surface of the wafer while the wafer is spinning preferably in the range of 2000–4000 rpm. The resultant film is preferably 5000–6000 angstroms thick. The wafer with the spin-on-glass film is then placed in the apparatus of the instant invention to process the spin-on-glass film to achieve a low-k value.

The treatment of the spin-on-glass material with the hydrated ammonia results in a porous spin on glass coating that has a low-k value. The process of creating the porous spin-on-glass coating is preferably performed in a temperature range of 15 to 25 degrees Celsius. The wafer is held within the chemical processing environment of the apparatus for a period of time between 40 and 60 seconds and with an ammonia concentration that is preferably in the range of 70 to 90 %. Wafers processed in similar conditions with spin-on-glass materials and the apparatus described herein, have produced wafers with low-k coating that 60 to 90% Si—H remaining and which exhibit k-values between 2.0 and 2.5.

Figure 3:
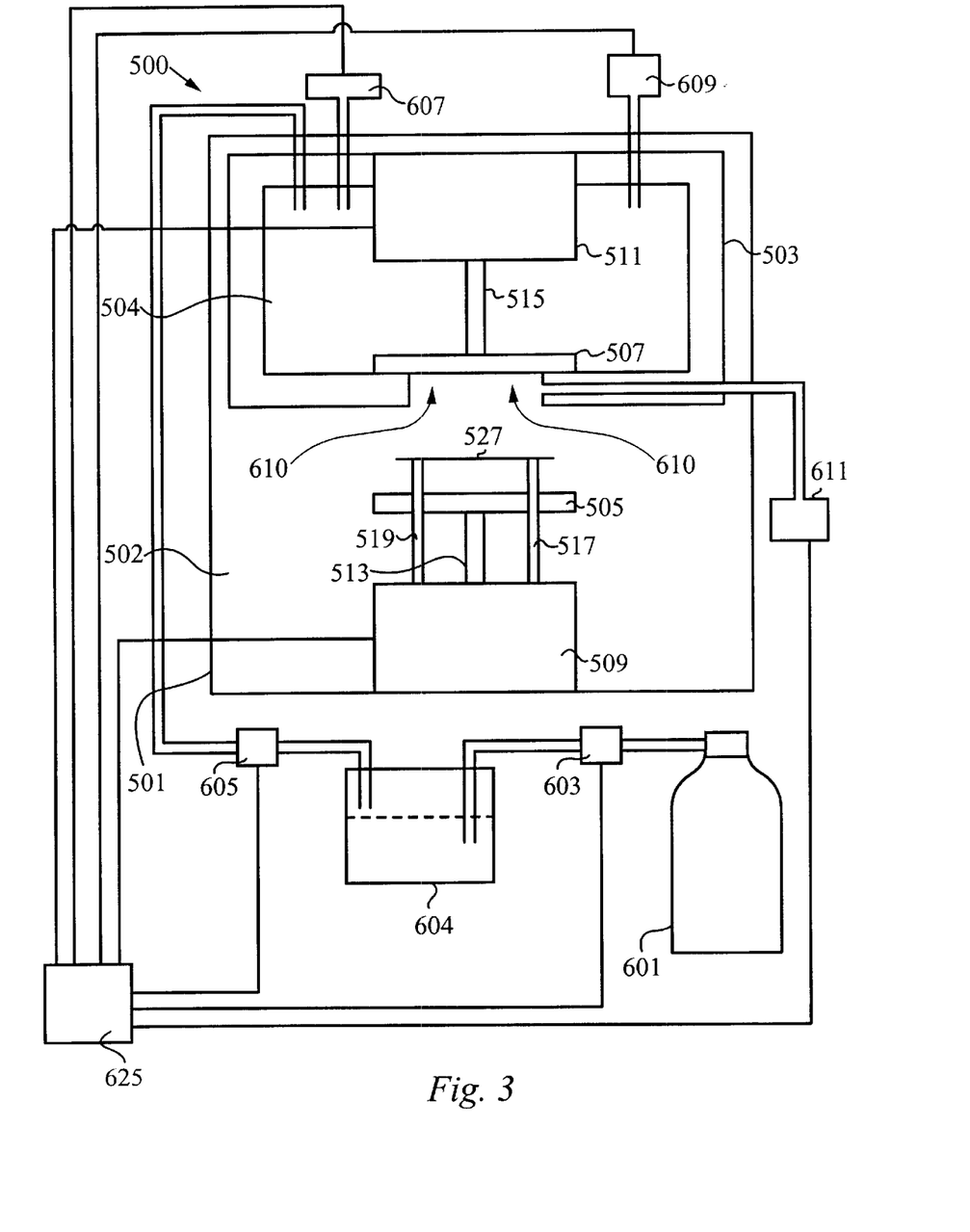
FIG. 3 is a schematic cross-sectional view of a multi-compartment wafer processing apparatus with a controllable chemical delivery system and a transfer mechanism in accordance with the preferred embodiment of the instant invention.

FIG. 3 is a schematic cross-sectional view of a multi-compartment wafer processing apparatus 500 with a controllable chemical delivery system and a transfer mechanism according to the preferred embodiment of the instant invention. The apparatus has a primary compartment 501 with a first processing environment 502 and a secondary compartment 503 with a second processing environment 504. The compartments 501 and 503 are coupled through a transfer passage 610 that is capable of being opened and closed to isolate a wafer 527 within a small volume transfer cavity by moving the tables 505 and 507. The tables 505 and 507 are moved up and down with the drive motors 509 and 511 that are coupled to the tables 505 and 507 through the shaft structures 513 and 515, respectively. The drive motors 509 and 511 are operated to isolate the first processing environment 502 from the second processing environment 504 through the transfer passage 610 and to isolate the wafer 527 with a small transfer volume between transfers, as described in detail above.

The controllable chemical delivery system comprises a chemical source 601, that is preferably ammonia, coupled to the secondary compartment 503. At any time during the transfer process or processing of the wafer, the sensor unit 607 monitors the chemical composition or chemical concentration of the secondary processing environment and signals the regulators 603 and 605 to deliver an appropriate quantity of processing chemical or chemicals to maintain a predetermined composition or concentration within the secondary processing environment. In an alterative embodiment of the invention, the primary compartment 501 is also configured with a chemical delivery and monitoring system with a feedback loop for maintaining a predetermined composition or concentration of a processing chemical in the first processing environment 502. Also, in other embodiments, the primary compartment 501 and/or the secondary compartment 503 are equipped with a vacuum source 609 for purging their respective processing environments.

The controllable chemical delivery system preferably has a filtration station and/or hydration station 604. In the case where the processing chemical 601 is ammonia, the station 604 is a hydration station with water containing a predetermined concentration ammonium hydroxide coupled to the secondary compartment 503 through the regulator 605. The chemical sensor unit 607 is preferably has a short path infrared sensor that measures the concentration of the ammonia, water or both within the secondary compartment 503. The chemical senor is coupled to a feed back control loop that signals the delivery of additional ammonia and or water to the compartment when the concentration of ammonia is below a selected value.

Preferably, the movable table 505 is configured to hold and support the wafer 527 between transfers. In a further embodiment, the apparatus is configured with a wafer support structure having a plurality of pins structures 517 and 519 for supporting the wafer 527 while the wafer is at rest within the compartment 501. The pin structures 517 and 519 pass through the movable table 505 such that when the movable table 505 is lowered, the wafer 527 is released from the table 505 onto the pin structures 517 and 519, as shown. When the table movable 505 is raised, the wafer 527 is released from the pin structures 517 and 519 onto the table 505.

According an alternative embodiment of the instant invention, the apparatus 500 is equipped with a vacuum or purging system 611 coupled to the transfer passage 610 such that when the tables 505 and 507 are in the closed position, the transfer cavity is capable of being purged to reduce cross-contamination between the primary and secondary process environments.

Preferably, the feed back control loop includes a computer system 625 module in communication with the sensor unit 607 and the regulators 603 and 605. The chemical sensor unit 607 measures the chemical concentration or composition of the processing environment 504 within the secondary compartment 503 and provides this information to the computer system 625. When the chemical concentration or composition of the processing environment 504 is measured to be below a threshold value, then the computer system 625 signals the regulators to 603 and 605 to open and deliver a regulated amount of the processing chemical 601 to the secondary compartment 503 thereby replenishing chemical concentration or composition of the processing environment 504 to the desired value. When the chemical concentration or composition of the processing environment 504 is measured to be above a threshold value, then the computer system 625 signals the vacuum 609 to purge an appropriate amount of the processing chemical from the secondary compartment 503.

According to a further embodiment of the invention, the operation of the apparatus 500 is automated with th assistance of the computer system 625. Accordingly, the computer system 625 is also coupled to the first table motor 509, the second table motor 511 and the vacuum systems 609 and 611. The computer system 625 is operated with software having the appropriate computer code to operate the apparatus in accordance with the method of the instant invention. Preferably, a user is able to select and adjust processing parameters including, but not limited to, the concentration of processing chemical within the processing environment 504, the temperature of the processing environment 504 and the duration of time that the wafer is exposed to the processing environment 504.

Figure 4:
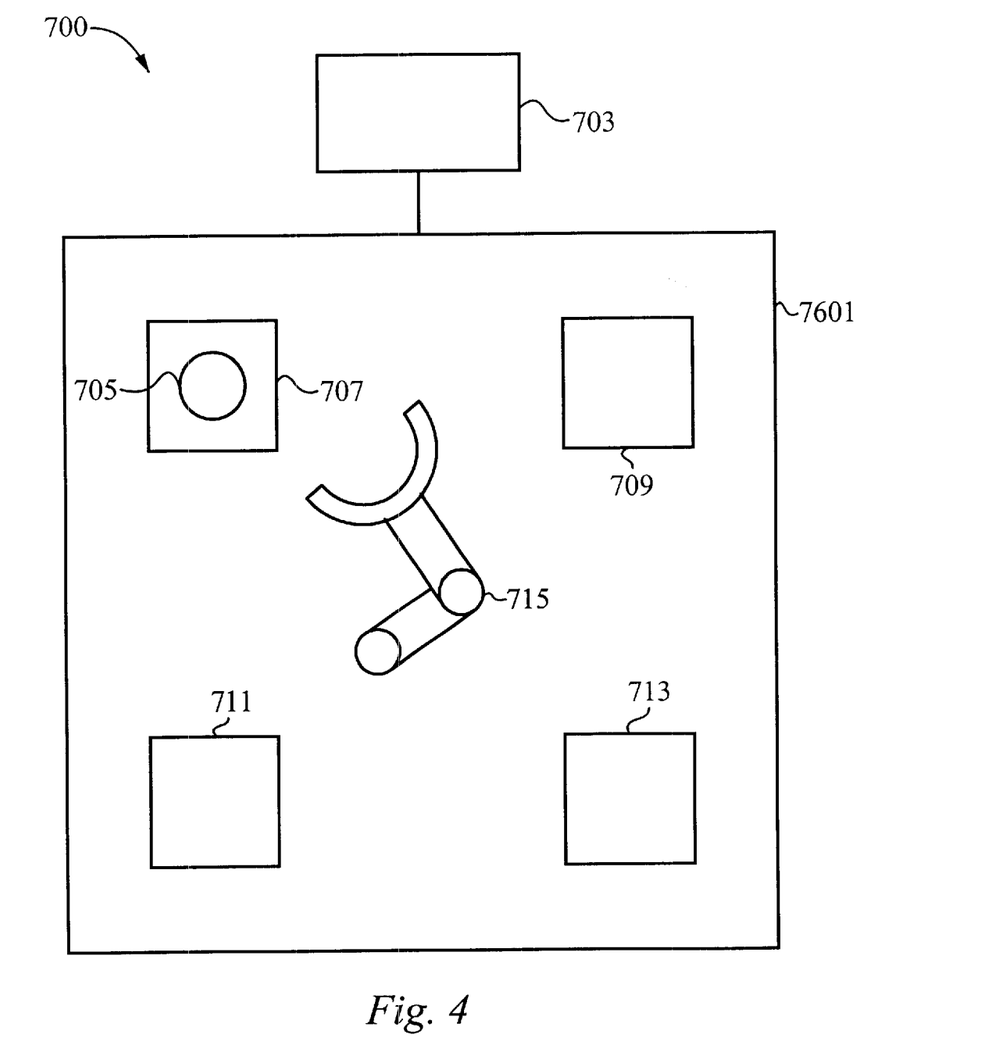
FIG. 4 is a schematic block diagram of a robotic wafer processing machine with a modular low-k processing station in accordance with the instant invention.

Referring now to FIG. 4, according to a preferred embodiment of the invention, a processing station 707, configured in accordance with the description, is one wafer processing station within a multi-station wafer processing system 700. The wafer processing system 700 has any number of processing stations such as a wafer storage station 709, a wafer annealing or bake station 711 and a wafer coating station 713. The wafers are moved between the processing stations 707, 709, 711 and 713 with a robotic arm 715. The system conditions and each of the station are controlled by a computer system 703 coupled to system body 701 and coupled to each of the stations 707, 709, 711 and 713. Software runs the computer to execute the appropriate processing sequence to accomplish the intended result. For example, the computer system 703 is used to select appropriate ammonia and water concentration within the chemical processing environment of the station 707. Preferably, the robotic arm 715 is configured to directly move wafers on and off of the first movable table 705.

The present invention has been described relative to a preferred embodiment. Improvements or modifications that become apparent to persons of ordinary skill in the art only after reading this disclosure are deemed within the spirit and scope of the application. Specifically, the operation of the apparatus is described, herein, in terms of two processing environments and two processing compartments. However, it is understood that the apparatus may be configured with any number of processing compartments and corresponding processing environments and that practicing the method of the instant invention does not depend on the number of processing compartments or processing environments. Further, practice of the invention is not limited to wafer processing applications. The apparatus and the method of the instant invention are useful for any number of applications that require constant and controllable surface processing by transferring a reaction surface of a structure between distinct processing environments.

What is claimed is:

1. A method of treating a wafer coated with a low-k material comprising:
   a. placing the wafer in a first compartment containing a first processing environment;
   b. isolating the wafer between the first compartment and a second compartment in a transfer cavity having a small transfer volume containing a portion of the first processing environment;
   c. opening the transfer cavity to the second compartment containing a second processing environment with the transfer cavity closed to the first compartment;
   d. monitoring a chemical composition of the second processing environment in the second compartment; and
   e. adjusting the chemical composition of the second processing environment in the second compartment when the chemical composition reaches a threshold value.

2. The method of claim 1, further comprising the step of purging the transfer volume prior to the step of opening the transfer cavity to the second compartment with the transfer cavity closed to the first compartment.

3. The method of claim 2, wherein the step of purging the transfer cavity comprises the additional steps of:
   a. drawing a vacuum on the transfer cavity; and
   b. backfilling the transfer cavity.

4. The method of claim 3, wherein small transfer volume is 10% or less than the volume of the second processing environment.

5. The method of claim 3, wherein small transfer volume is less than five times the volume occupied by the wafer.

6. The method of claim 1, wherein the chemical composition of the second processing environment in the second compartment is monitored with an infrared sensor that monitors the concentration of ammonia.

7. The method of claim 1, further comprising providing convection to the second processing environment after opening the transfer cavity to the second compartment containing the second processing environment.

* * * * *